INVENTOR
WILLIAM B. HEMPHILL
BY Sidney A. Johnson
ATTORNEY

Patented Sept. 30, 1952

2,612,568

UNITED STATES PATENT OFFICE 2,612,568

AUTOMATIC GAIN CONTROL SYSTEM

William B. Hemphill, Dallas, Tex., assignor, by mesne assignments, to Socony-Vacuum Oil Company, Incorporated, New York, N. Y., a corporation of New York Application November 7, 1946, Serial No. 708,331

8 Claims. (Cl. 179—171)

This invention relates to arrangements for controlling the gain of an amplifier system and is particularly concerned with control of the gain of reflection amplifiers used in seismic prospecting systems.

In general, the gain of an amplifier is varied by rectification of the amplified signal to provide a variable direct-current biasing voltage applied to one or more of the amplifier tubes and the rate of change of the biasing voltage for a given change in signal level is arbitrarily fixed by the preselection of the circuit constants.

In accordance with the present invention, the rapidity of response of an automatic gain-control system is varied as a predetermined function of time beginning with occurrence of a particular event; more particularly and with respect to the amplification and recording of seismic signals resulting from the detonation of an explosive charge for reflection from strata below the earth's surface, it is provided that the time constant of the gain-control system shall be initially low so as to insure immediate and marked reduction of the amplifier gain in response to the first or direct seismic waves and it is further provided that in the following interval the time constant of the gain-control system shall be increased in avoidance of marked changes in amplifier gain so far as adjacent groups of the subsequent signals are concerned but without impairment of the effectiveness of the automatic gain-control system to correct for the general trend of the level of signals due to the reflected seismic waves. This has the advantage that the gain of the amplifier is high at the time the charge is detonated. In consequence, the signal comprising the first break, or the signal resulting from the direct-traveling waves, has a steep wave front as appearing on the seismogram, thus precisely indicating the time of arrival of the first direct-traveling wave. However, by providing that the time constant of the gain-control system shall initially be low, the gain is contracted with great rapidity to take care of these signals whose amplitude is much greater than the later-arriving reflections. By then increasing the time constant of the automatic gain-control system, the subsequent signals pass through the amplifier without effecting marked change in gain as between successive adjacent groups of signals.

Further and more specifically in accordance with the invention, the rectifier circuit of the gain-control system comprises a resistance-reactance network which includes as one of its components the anode-cathode resistance, for example, of an electronic tube. The time constant of the network and therefore the speed of response of the automatic gain control is varied by changing the grid bias of the tube preferably provided, for seismic-signal amplifiers, by the combination of a resistance-reactance network and a source of fixed voltage which is connected in circuit therewith in response to a time-break signal so thereafter to effect increase of the time constant of the network as a preselected function of time.

The invention further resides in systems, combinations, and arrangements having features of novelty hereinafter disclosed and claimed.

For a more detailed understanding of the invention and for illustration of a preferred embodiment thereof, reference is made to the accompanying drawings, in which.

In seismic prospecting systems, the seismic waves resulting from explosion of a charge and produced below the surface of the earth are received by a spread or group of geophones or equivalent suitably spaced with respect to each other and to the explosion point. The signals produced by the several geophones, after amplification, are impressed upon a suitable recording device, for example, a multiple trace oscillograph which produces a record of the various signals which may be interpreted in determination of the depth and contours of subterranean strata. To produce a record in which the various waves as received by the several geophones are clearly distinguishable, the gain of each of the amplifiers is automatically controlled.

Figure 1:
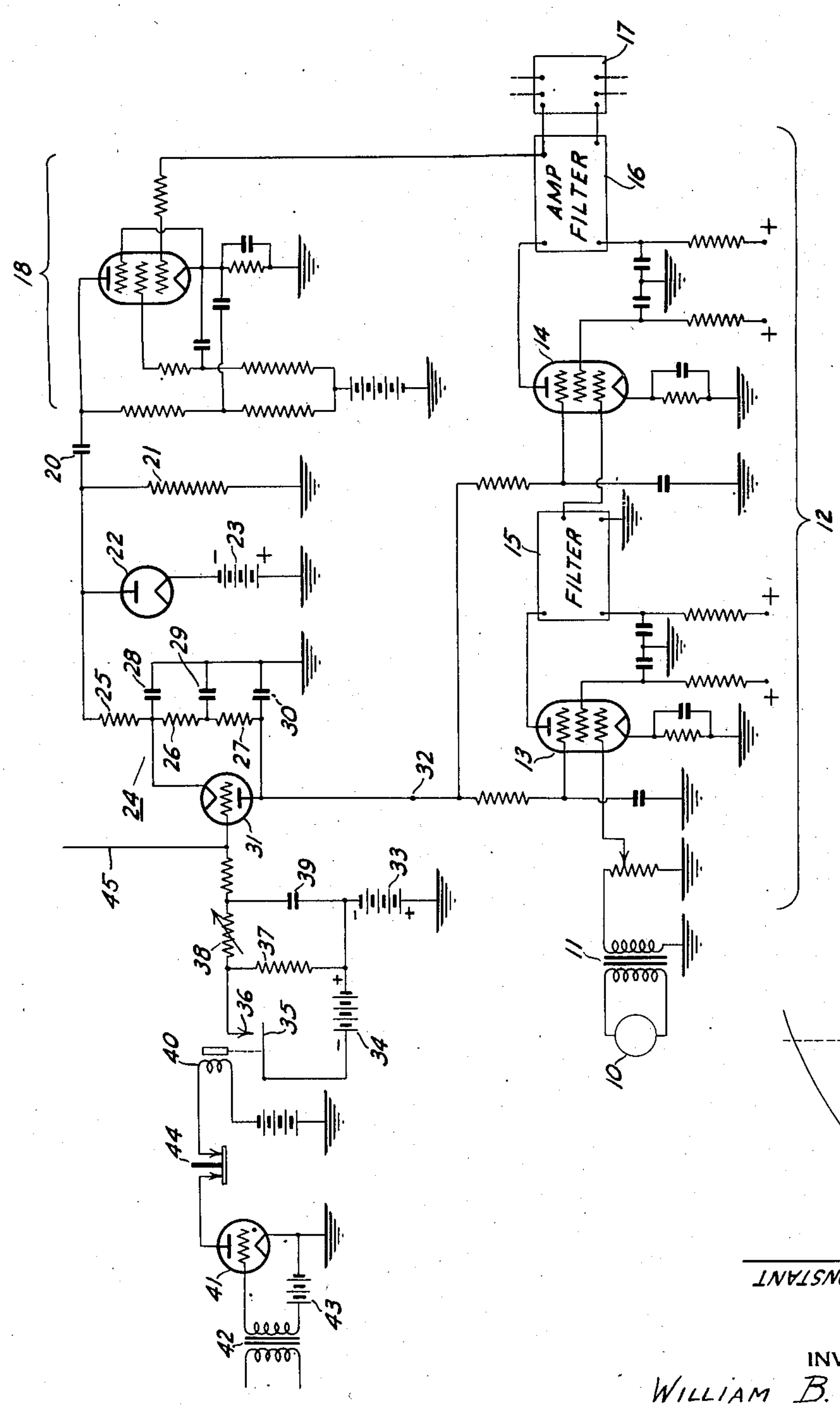
Fig. 1 is a schematic diagram of an amplifier channel for a seismic prospecting system.

Referring to Fig. 1, the signal produced by the geophone 10 is impressed as by transformer 11 upon the input circuit of an amplifier 12 of suitable number of stages and which in the particular arrangement shown includes the amplifier tubes 13 and 14 suitably coupled by a filter network 15 or equivalent having suitable frequency-response characteristics to favor frequencies corresponding with seismic wave frequencies and to discriminate against other frequencies. The tube 14 may be followed by one or more additional amplifier-filter stages generically represented by block 16 and the output of the amplifier is fed to a recorder represented by block 17.

For automatic control of the gain of the amplifier, the amplified signal diverted from a suitable point in the amplifier system 12 is rectified to provide a direct-current biasing potential which is applied to one or more of the amplifier tubes thus to control the gain. Specifically in the particular system shown, the input circuit of amplifier 18 of the automatic gain-control system is suitably coupled to the output circuit of the signal amplifier tube 14 and the amplifier 18 is in turn coupled to a rectifier system as by the condenser 20 and resistor 21. The rectifier 22, which may be of any suitable type, such as a diode, derives from the signal output of the amplifier 18 a direct-current gain-control voltage proportional to the amplitude of the seismic signal and which in the particular system shown is applied to vary the potential of the suppressor grids of the tubes 13 and 14 of the signal amplifier 12.

The rectifier circuit includes the battery 23 or equivalent source of direct current which determines the potential of the suppressor grids of tubes 13 and 14, and therefore the gain of the amplifier, under conditions of zero signal. This potential or bias is varied by the algebraic addition thereto of a variable direct-current biasing voltage derived by rectifier 22 from the signal output of the amplifier 18. The circuit of rectifier 22 includes the smoothing network or filter 24 comprising the resistors 25, 26 and 27 in series in the load or output circuit of the rectifier and the shunt capacitors 28, 29 and 30. The time constant of resistance-reactance network 24 determines the rate of change of the gain-control voltage applied to the suppressor grids of tubes 13 and 14 for any given amplitude of signal impressed upon the rectifier circuit.

It is desirable for control of gain of seismic signal amplifiers, for example, that in the interval following a shot, the automatic gain control be rapidly acting in order immediately and to marked extent to contract the amplification in response to the first direct-traveling waves due to the shock. Initially the amplifier gain is high to insure that the wave front of the first waves as recorded by the seismograph shall be very steep and so afford a precise time indication and the gain control must be very fast-acting to keep the recorded traces of the signals picked up by the geophones of a spread within bounds avoiding a confused common record. However, an automatic gain-control system having high speed of response best suiting it for this purpose is ill suited for controlling the gain of the amplifier to give a good record of the subsequent reflected waves; for example, for successive groups of such waves there would be marked change in gain of the amplifier with consequent greater difficulty in interpretation of the seismogram. Instead of selecting a compromise time constant for network 24, it is provided by the present invention that initially the time constant of the network 24 shall be low but shall be greatly increased, independently of signal amplitude, for reception of reflected seismic waves to avoid marked difference in gain of the amplification during the passage therethrough of adjacent groups of signals, the automatic gain-control system, however, remaining effective to vary the amplifier gain, as an inverse function of signal amplitude, in accordance with the general trend of the signal level.

In attainment of that end, the anode-cathode resistance of the tube 31 is utilized as one of the resistors of the smoothing network 24. Specifically, the anode-cathode resistance of tube 31 is effectively in shunt to the resistors 26 and 27 of network 24. The effective magnitude of the internal or interelectrode resistance of tube 31 is controlled, in the particular arrangement shown, by variation of its grid potential. The control grid circuit of tube 31 includes two batteries 33 and 34, or other source of direct-current voltage. Assuming that contacts 35 and 36 are open, the potential of the grid of tube 31, with respect to ground, is that of source 33 alone. In considering the total bias on the tube, it is necessary to also consider the potential of the cathode with respect to ground, which, at the arrival of the time break, is that of source 23 alone. However, since 23 is considered to be a fixed voltage source, the change in bias on the tube is due to the change of potential of the grid with respect to ground. For the purposes herein specifically discussed, the magnitude of voltage 33 may be assumed to be such that the internal resistance of tube 31 is at or near its minimum value at the arrival of the first breaks, and consequently the time constant of network 24 is at or near its minimum, so providing for rapid change of the gain-control voltage derived from the output of the selected stage of amplifier 12.

Upon closure of contacts 35 and 36, current flows from the source 34 through the resistor 37, thus producing across that resistor a voltage drop effective to charge the condenser 39 at a rate determined by the magnitude of resistance of resistor 38 and the capacity of condenser 39. The potential difference across condenser 39 is effectively in series with the voltage of the source 33 so that the potential of the control grid of tube 31 is the algebraic sum of these two voltage differences, the former fixed and the latter varying as a function of time in accordance with the time constant of the network including the resistor 38 and condenser 39. Preferably, and as shown, the resistor 38 is variable for predetermination of the rate at which the tube potential of grid 31, and therefore its anode-cathode resistance, varies upon closure of contacts 35 and 36.

Figure 2:
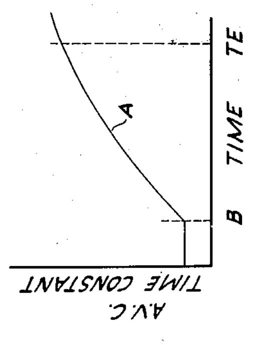
Fig. 2 is an explanatory figure referred to in discussion of the operation of the system of Fig. 1.

It therefore appears that upon closure of contacts 35 and 36, the time constant of network 24 in the automatic gain-control circuit will be progressively lengthened with consequent reduction in the speed of response of the automatic control system to changes in level of the signal. For example, as shown in Fig. 2, prior to the time of closure B of contacts 35 and 36 the time constant of network 24 may be low, whereas upon closure of the contacts the time constant increases, generally in accordance with curve A and at time TE, the end of the recording interval, is materially higher than at time B.

For control of the gain of an amplifier channel in a seismic prospecting system, the contacts 35 and 36 may be those of a relay 40 energized in response to a time-break signal, that is, for example a signal produced upon arrival of a seismic wave at a selected geophone, for example, the uphole geophone of a spread. Specifically and as shown, the relay 40 may be in the anode circuit of a Thyratron 41 coupled as by transformer 42 to the source of the time-break signal. In accordance with usual practice, the Thyratron is so biased as by source of voltage 43 that no plate current flows until arrival of that signal. The switch 44 is included to break the anode circuit of a Thyratron after the end of the recording period to reset the system for the next shot.

For changing the time constant of network 24 in response to a "first-break" signal due to arrival at the geophone of the direct-traveling waves instead of to a "time-break" signal or uphole-break signal, the tube 41 or equivalent is triggered by a signal from geophone 10 or from the amplified signal at, for example, the output terminals of filter 16 or of the amplifier 18. Particularly for such case, it is desirable to increase the time constant of network 24 in response to the initiating signal abruptly and by a large step. Such action is attainable with the arrangement shown by selection or adjustment of the magnitudes of resistor 38 and capacitor 39 so that the product of their resistance and capacity is correspondingly low.

It shall be understood that the amplifier channels associated with the geophones of a spread may be all similarly controlled by a single master controller comprising the resistance-reactance network 37, 38 and 39, the associated sources of direct current 33, 34 and relay 40. Briefly stated, the grid of tube 31 may be connected as indicated by conductor 45 to the corresponding grids of tubes corresponding with tube 31 and similarly associated with the smoothing networks of the automatic gain control systems of other amplifier channels.

It shall be understood the invention is not limited to the specific arrangement and use described, but may be used in other relations and with changes and modifications within the scope of the appended claims.

What is claimed is:

1. An automatic gain-control arrangement for a seismic-signal amplifier comprising a rectifier responsive to the seismic signal in said amplifier to supply a direct-current biasing voltage for one or more stages of the amplifier, means for applying said direct-current voltage to said stages including a smoothing network in circuit with said rectifier, an electronic tube whose anode-cathode resistance affects the time constant of said network, and means for varying said resistance to change the speed of response of said gain-control system as a predetermined function of time and independently of signal amplitude comprising a resistance-reactance network in the input circuit of said tube, a source of fixed direct-current voltage, and switching means operable to include said source in circuit with said resistance-reactance network.

2. An automatic gain-control arrangement for a seismic signal amplifier comprising a rectifier in the output system of a stage of the amplifier to supply a direct-current biasing voltage for one or more stages of the amplifier, means for applying said biasing voltage to said stages including a smoothing network in circuit with said rectifier, an electronic tube whose anode-cathode resistance affects the time constant of said network, and means for varying said resistance to vary the speed of response of said gain-control system comprising a resistance-reactance network in the input system of said tube, a source of fixed direct-current voltage, and a time-break relay for including said source in circuit with said resistance-reactance network.

3. An automatic gain-control arrangement for a seismic signal amplifier having such characteristic that the signals due to the initial direct waves effect substantially immediate and marked reduction of amplifier gain whereas the gain is thereafter more slowly varied to correct for general trends in signal amplitude without marked change for adjacent signal groups comprising a rectifier in the output circuit of a stage of the amplifier to provide a biasing voltage for one or more stages thereof, a low time constant network interconnecting said rectifier in said stages, an electronic tube whose anode-cathode resistance is included in said network, a resistance-capacity network in the input system of said tube, a source of fixed direct-current voltage, and means responsive to a time-break signal for including said source in circuit with said resistance-reactance network to effect increase of said anode-cathode resistance as a predetermined function of time.

4. An automatic gain-control arrangement for an amplifier comprising a rectifier in the output system of a stage of the amplifier to provide a gain-control voltage for one or more stages thereof, a resistance-reactance network interconnecting said rectifier with said stages, an electronic tube whose anode-cathode resistance is included in said network, a source of fixed biasing voltage in the grid circuit of said tube for determining the minimum time constant of said network, and means for increasing the time constant of said network including a second source of biasing voltage and a second resistance-reactance network in circuit therewith in said grid circuit.

5. An automatic gain-control arrangement for a seismic signal amplifier comprising a rectifier in the output system of an amplifier stage to provide a gain-control voltage for one or more amplifier stages, a resistance-reactance network in circuit with said rectifier and comprising the anode-cathode resistance of an electronic tube, a source of fixed voltage biasing the grid of said tube to extent insuring immediate and marked change in the magnitude of said gain-control voltage in response to the seismic signals first following a shot, and means for increasing the time constant of said network in avoidance of marked changes in gain for adjacent groups of the subsequent signals comprising a second source of biasing voltage, a second resistance-reactance network, and means responsive to a time-break signal effectively to include said second source and second network in the grid circuit of said tube.

6. A seismic-signal amplifier for a seismic prospecting system arranged to have high gain before detonation of the charge, thereafter to have its gain contracted and later expanded with an automatic gain control whose time rate of response is high prior to the shot instant and is made lower after the shot instant which comprises means for varying the amplifier gain comprising a rectifier responsive to the amplified signal and connected to apply the direct-current voltage derived from the signal as a biasing voltage to one or more stages of the amplifier for control of gain as an inverse function of signal amplitude, means for varying the speed of response of said automatic gain-control means to changes in signal level as a predetermined function of time comprising a network in circuit with said rectifier and including a resistance variable to change the time constant of said network, and means for varying said resistance solely in accordance with said predetermined function of time and independently of signal amplitude, and means for initiating operation of said second-named means comprising switching means responsive to a signal produced upon detonation of the charge for initiating operation of said resistance varying means whereby the magnitude of said biasing voltage subsequently varies in opposite senses for increases and decreases in signal amplitude, the speed of response of said biasing voltage to a change in signal amplitude varying in accordance with said predetermined function of time and independently of signal amplitude.

7. An automatic gain control system for a seismic signal amplifier comprising rectifying means for deriving a direct-current biasing voltage which varies in accordance with the amplitude of signal amplified thereby, a resistance-reactance network interconnecting said rectifying means and said amplifier for applying said voltage to said amplifier, an electronic tube whose anode-cathode path forms a resistor of said network, a second resistance-reactance network and a source of direct-current voltage both in the grid circuit of said tube and external to the circuit including said rectifying means and said first-named resistance-reactance network, and means operative in coincidence with the occurrence of a preselected event for initiating predetermined changes in the direct-current voltage on the grid of said tube to effect progressive variation of the time constant of said first-named resistance-reactance network independently of the signal amplitude.

8. An amplifier for a seismic prospecting system arranged to have a high gain before detonation of the charge generating seismic waves and thereafter to have its gain contracted and later expanded with an automatic gain control whose time rate of response is high prior to the detonation of said charge and is progressively made lower at a predetermined rate after detonation of said charge which comprises an automatic gain-control circuit including a rectifier connected to derive from a seismic wave signal in the amplifier a gain-control voltage applied to at least one stage of the amplifier to vary the gain as an inverse function of signal amplitude, means for varying the speed of response of said gain-control circuit including a resistance-reactance network in said automatic gain control circuit of said amplifier, a vacuum tube whose interelectrode resistance forms a portion of said resistance-reactance network, and biasing means in the grid circuit of said tube and external to the gain-control circuit including said rectifier to control said interelectrode resistance independently of signal amplitude, and means operable in predetermined time relation with respect to the instant of detonation of said charge to vary said interelectrode resistance as a predetermined function of time thereby to vary the time rate of response of said automatic gain control system independently of the signals received by said amplifier.

WILLIAM B. HEMPHILL.

REFERENCES CITED

The following references are of record in the file of this patent:

UNITED STATES PATENTS

| Number | Name | Date |
|---|---|---|
| 2,284,102 | Rosencrans | May 26, 1942 |
| 2,316,354 | Moritz, Jr. | Apr. 13, 1943 |
| 2,352,825 | Fay | July 4, 1944 |
| 2,375,283 | Cloud | May 8, 1945 |
| 2,404,160 | Boucke | July 16, 1946 |
| 2,408,001 | Shimek | Sept. 24, 1946 |
| 2,430,983 | Hoover, Jr. | Nov. 18, 1947 |